United States Patent
Kim et al.

(10) Patent No.: US 9,741,574 B2
(45) Date of Patent: Aug. 22, 2017

(54) CYCLIC DEPOSITION METHOD FOR THIN FILM AND MANUFACTURING METHOD FOR SEMICONDUCTOR, AND SEMICONDUCTOR DEVICE

(71) Applicant: EUGENE TECHNOLOGY CO., LTD., Yongin-si, Gyeonggi-do (KR)

(72) Inventors: Hai-Won Kim, Icheon-si (KR); Seok-Yun Kim, Yongin-si (KR)

(73) Assignee: EUGENE TECHNOLOGY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/915,919

(22) PCT Filed: Sep. 23, 2014

(86) PCT No.: PCT/KR2014/008813
§ 371 (c)(1),
(2) Date: Mar. 2, 2016

(87) PCT Pub. No.: WO2015/068948
PCT Pub. Date: May 14, 2015

(65) Prior Publication Data
US 2016/0300723 A1    Oct. 13, 2016

(30) Foreign Application Priority Data
Nov. 8, 2013 (KR) .......... 10-2013-0135639

(51) Int. Cl.
*H01L 29/30* (2006.01)
*H01L 21/28* (2006.01)
(Continued)

(52) U.S. Cl.
CPC ...... *H01L 21/28282* (2013.01); *C23C 16/402* (2013.01); *C23C 16/45536* (2013.01);
(Continued)

(58) Field of Classification Search
CPC ............ C23C 16/402; C23C 16/45536; H01L 21/0214; H01L 21/02164; H01L 21/02274;
(Continued)

(56) References Cited

U.S. PATENT DOCUMENTS 7,391,075 B2    6/2008   Jeon et al.
8,119,210 B2    2/2012   Narwankar et al.
(Continued)

FOREIGN PATENT DOCUMENTS

JP    2009-253195 A    10/2009
KR   10-2005-0060268 A   6/2005
(Continued)

OTHER PUBLICATIONS

Japanese Office Action issued Feb. 23, 2017.

*Primary Examiner* — Robert Bachner
(74) *Attorney, Agent, or Firm* — Rabin & Berdo, P.C.

(57) ABSTRACT

Provided is a method of cyclically depositing a thin film including: performing an oxide depositing operation of repeatedly performing a deposition operation, a first purge operation, a reaction operation, and a second purge operation, wherein the deposition operation deposits silicon on a target by injecting a silicon precursor into a chamber into which the target is loaded, the first purge operation removes a non-reacted silicon precursor and a reacted byproduct from inside the chamber, the reaction operation supplies a first reaction source including oxygen into the chamber to form the deposited silicon as an oxide including silicon, and the second purge operation removes a non-reacted first reaction source and a reacted byproduct from the inside of the chamber; and performing a plasma processing operation of
(Continued)

supplying plasma made of a second reaction source including nitrogen to the inside of the chamber to process the oxide including the silicon.

11 Claims, 11 Drawing Sheets

(51) Int. Cl.
    *C23C 16/40*     (2006.01)
    *C23C 16/455*     (2006.01)
    *H01L 29/423*     (2006.01)
    *H01L 29/51*     (2006.01)
    *H01L 29/66*     (2006.01)
    *H01L 29/792*     (2006.01)
    *H01L 21/02*     (2006.01)

(52) U.S. Cl.
    CPC ...... *H01L 21/0228* (2013.01); *H01L 21/0234* (2013.01); *H01L 21/02164* (2013.01); *H01L 21/02274* (2013.01); *H01L 21/02332* (2013.01); *H01L 29/42364* (2013.01); *H01L 29/518* (2013.01); *H01L 29/66833* (2013.01); *H01L 29/792* (2013.01); *H01L 21/0214* (2013.01); *H01L 21/0262* (2013.01); *H01L 21/02532* (2013.01)

(58) Field of Classification Search
    CPC ........... H01L 21/0228; H01L 21/02332; H01L 21/0234; H01L 21/02532; H01L 21/0262; H01L 21/28282; H01L 29/42364; H01L 29/518
    See application file for complete search history.

(56) References Cited

U.S. PATENT DOCUMENTS

| | | | |
|---|---|---|---|
| 2005/0260347 | A1 | 11/2005 | Narwankar et al. |
| 2006/0118858 | A1 | 6/2006 | Jeon et al. |
| 2008/0217677 | A1 | 9/2008 | Jeon et al. |
| 2008/0283905 | A1* | 11/2008 | Won ............ H01L 27/115 257/326 |
| 2013/0101752 | A1* | 4/2013 | Kim ............ C23C 16/345 427/539 |

FOREIGN PATENT DOCUMENTS

| | | |
|---|---|---|
| KR | 10-2007-0013337 A | 1/2007 |
| KR | 10-0688575 B1 | 3/2007 |
| KR | 10-2012-0012582 A | 2/2012 |
| KR | 10-2012-0054660 A | 5/2012 |

* cited by examiner

CYCLIC DEPOSITION METHOD FOR THIN FILM AND MANUFACTURING METHOD FOR SEMICONDUCTOR, AND SEMICONDUCTOR DEVICE

TECHNICAL FIELD

The present disclosure relates to a method of cyclically depositing a thin film, a semiconductor manufacturing method, and a semiconductor device, and more particularly, to a method of cyclically depositing a thin film in which an oxide is processed through plasma including nitrogen, a semiconductor manufacturing method, and a semiconductor device.

BACKGROUND

With the advance of semiconductor industries and the requirements of users, recently, electronic devices are being more highly integrated and have high performance, and thus, semiconductor devices that are the main components of the electronic devices are also required to be highly integrated and have high performance. However, it is difficult to realize a fine structure for highly integrating semiconductor devices.

For example, a thinner insulation layer is required for realizing the fine structure, but if the insulation layer is formed to a thin thickness, layer properties such as insulation characteristic are degraded. Also, it is becoming difficult to form a thin film with a thin thickness and obtain excellent step coverage.

PATENT LITERATURE

Korean Patent Publication No. 2005-0060268 published on Jun. 22, 2005

SUMMARY

The present invention provides a method of cyclically depositing a thin film in which it is possible to deposit an oxide having an excellent layer property and step coverage, a semiconductor manufacturing method, and a semiconductor device.

The present invention also provides thin film in which the erasing speed of a semiconductor device has increased, a semiconductor manufacturing method, and a semiconductor device.

Other objects of the present invention will be clarified through the following detailed description and the accompanying drawings.

According to an aspect, a method of cyclically depositing a thin film includes performing an oxide depositing operation of repeatedly performing a deposition operation, a first purge operation, a reaction operation, and a second purge operation, wherein the deposition operation deposits silicon on a target by injecting a silicon precursor into a chamber into which the target is loaded, the first purge operation removes a non-reacted silicon precursor and a reacted byproduct from inside the chamber, the reaction operation supplies a first reaction source including oxygen into the chamber to form the deposited silicon as an oxide including silicon, and the second purge operation removes a non-reacted first reaction source and a reacted byproduct from the inside of the chamber; and performing a plasma processing operation of supplying plasma made of a second reaction source including nitrogen to the inside of the chamber to process the oxide including the silicon.

The first reaction source may be one or more gases selected from the group including $O_2$, $O_3$, and $N_2O$.

The plasma treatment operation may include injecting one or more ignition gases selected from the group including Ar, He, Kr and Xe and generating the plasma from the second reaction source.

The reaction operation may include using, $O_2$— (oxygen anion) or O* (oxygen radical) formed by using plasma at $O_2$ atmosphere, as the first reaction source.

The second reaction source may be one or more gases selected from the group including $N_2$ and $NH_3$.

In the oxide deposition operation, an internal pressure of the chamber may be 0.01 Torr to 10 Torr.

In the plasma treatment operation, an internal pressure of the chamber may be 0.01 Torr to 10 Torr.

Before the plasma treatment operation, the deposition operation, the first purge operation, the reaction operation and the second purge operation may be repeated three times to fifty times.

The oxide deposition operation and the plasma treatment operation may be repeated.

According to another aspect, it is possible to deposit a tunnel oxide through any one of the methods.

A thickness of the tunnel oxide may be 20 Å to 100 Å.

A nitrogen concentration in the tunnel oxide may be 0.5 atomic % to 20 atomic %.

A capture layer, a charge blocking layer and a gate layer may be sequentially formed on the tunnel oxide.

According to another embodiment, in a non-volatile memory cell in which a tunnel oxide and a capture layer, a charge blocking layer, and a gate layer are sequentially stacked, a nitrogen concentration in the tunnel oxide may be 0.5 atomic % to 20 atomic %.

DETAILED DESCRIPTION OF EMBODIMENTS

Figure 1:
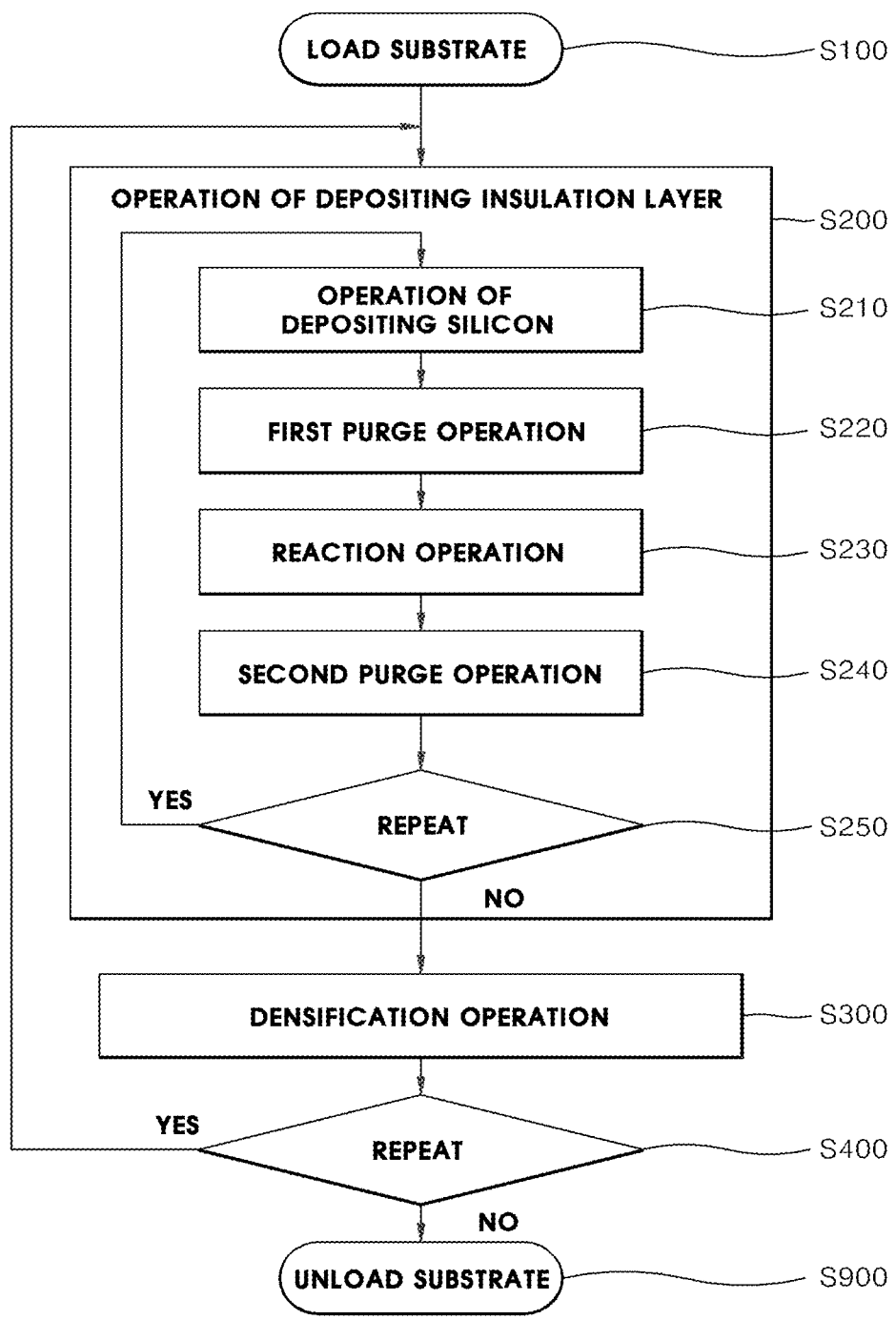
FIG. 1 is a flowchart illustrating a method of cyclically depositing a thin film, according to an embodiment of the present invention.

Exemplary embodiments of the present invention are described below in more detail with reference to the accompanying drawings, FIGS. 1 to 12. Embodiments of the present invention may be implemented in many different forms and the scope of the present invention should not be construed to be limited to the embodiments to be described below. The embodiments are provided to explain the present invention to a person skilled in the art in more detail. Thus, the shape of each component in the drawings may be exaggerated to emphasize descriptions.

FIG. 1 is a flowchart illustrating a method of cyclically depositing a thin film, according to an embodiment of the present invention.

As shown in FIG. 1, a substrate is loaded into a chamber of a semiconductor manufacturing apparatus in operation S100. An oxide is deposited on the substrate loaded into the chamber in operation S200, and silicon is deposited for depositing the oxide in operation S210. First purge operation S220, reaction operation S230, and second purge operation S240 are performed together.

In operation S210, silicon is deposited on the substrate by injecting a silicon (Si) precursor into the chamber for depositing silicon. After silicon is deposited on the substrate, a first purge operation of removing a non-reacted silicon precursor and a byproduct is performed in operation S220.

Subsequently, a reaction operation that forms an oxide including silicon by reacting silicon, formed on the substrate, with a reaction source is performed in operation S230. To form silicon as the oxide including silicon, a first reaction source may be injected into the chamber. The first reaction source, for example, may be one or more source selected from the group consisting of $O_2$, $O_3$, and $N_2O$. Also, the first reaction source may be a gas including an oxygen atom such as $O_2$ or $O_3$. Alternatively, the first reaction source may be O* (oxygen radical) or $O_{2-}$ (oxygen anion) that is formed of plasma at an $O_2$ atmosphere.

Subsequently, a second purge operation of removing a reacted byproduct and a reaction source or an ignition gas from inside the chamber is performed in operation S240.

Operation S210 of depositing the oxide, first purge operation S220, reaction operation S230, and second purge operation S240 may be repeatedly performed. Operation S210 of depositing the oxide, first purge operation S220, reaction operation S230, and second purge operation S240, for example, may be repeated three to fifty times.

The constant temperature of the substrate and a constant pressure inside the chamber may be maintained in operation S200 of depositing the oxide that includes operation S210 of depositing the oxide, first purge operation S220, reaction operation S230, and second purge operation S240.

In operation S210 of depositing each silicon, at least one silicon atomic layer may be formed on the substrate. The oxide including silicon may be formed to have a thickness of twenty Å to several tens of Å. After the oxide including silicon is formed, a plasma treatment operation is performed in operation S300.

To perform plasma treatment on the oxide including silicon, a plasma atmosphere may be formed inside the chamber. Also, together with the plasma atmosphere, a second reaction source may be injected into the chamber.

The second reaction source, for example, may be one or more sources selected from the group consisting of $O_2$, $O_3$, $N_2$, and $NH_3$.

To obtain an oxide including silicon and having a desired thickness, operation S200 of depositing the oxide and plasma treatment operation S300 may be repeatedly performed depending on the case in operation S400.

When the oxide including silicon and having a desired thickness is formed, the substrate may be unloaded from the chamber in operation S900.

Figure 2:
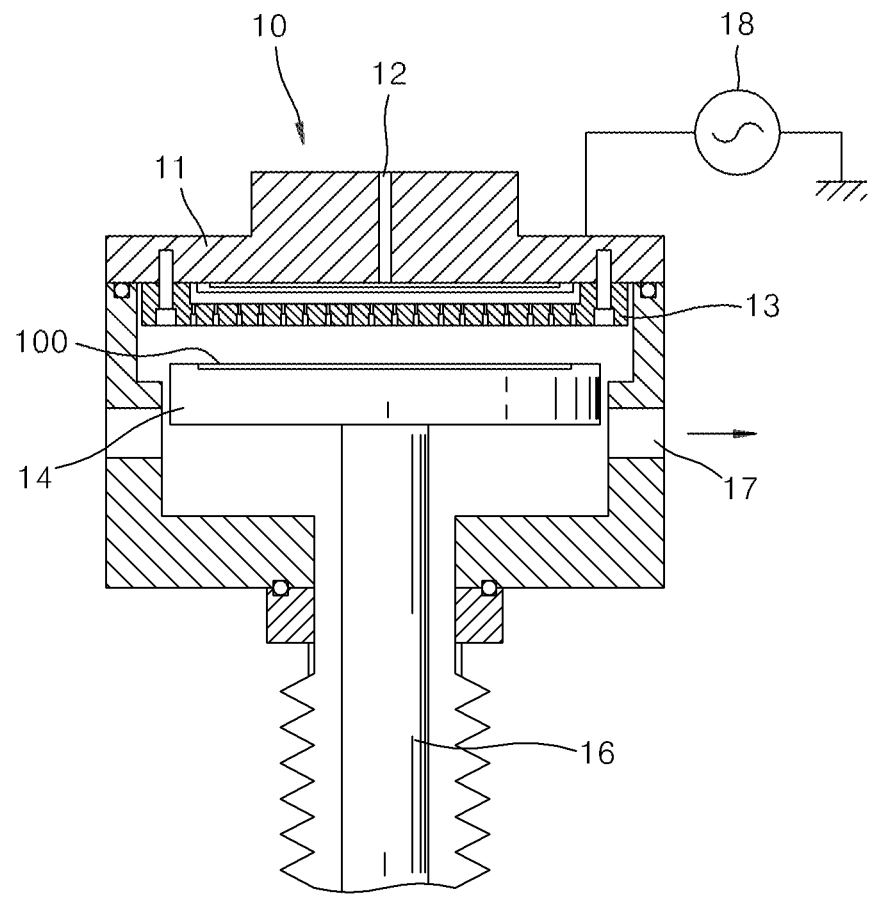
FIG. 2 is a schematic, sectional view of a semiconductor manufacturing apparatus performing a method of cyclically depositing a thin film, according to an embodiment of the present invention.

FIG. 2 is a schematic, sectional view of a semiconductor manufacturing apparatus performing a method of cyclically depositing a thin film, according to an embodiment of the present invention.

As shown in FIG. 2, an introduction part 12 for introducing a reaction source into a chamber 11 of a semiconductor manufacturing apparatus 10 is formed. The reaction source introduced by the introduction part 12 may be injected into the chamber 11 through a shower head 13.

A substrate 100 for deposition is disposed on a chuck 14, which is supported by a chuck supporter 16. When necessary, the chuck 14 applies heat to the substrate 100 such that the substrate 100 has a certain temperature. Deposition is performed by the semiconductor manufacturing apparatus 10, and thereafter, the discharge from the chamber 11 is performed by a discharge part 17. Moreover, to form a plasma atmosphere, the semiconductor manufacturing apparatus 10 may include a plasma generation part 18.

Figure 3:
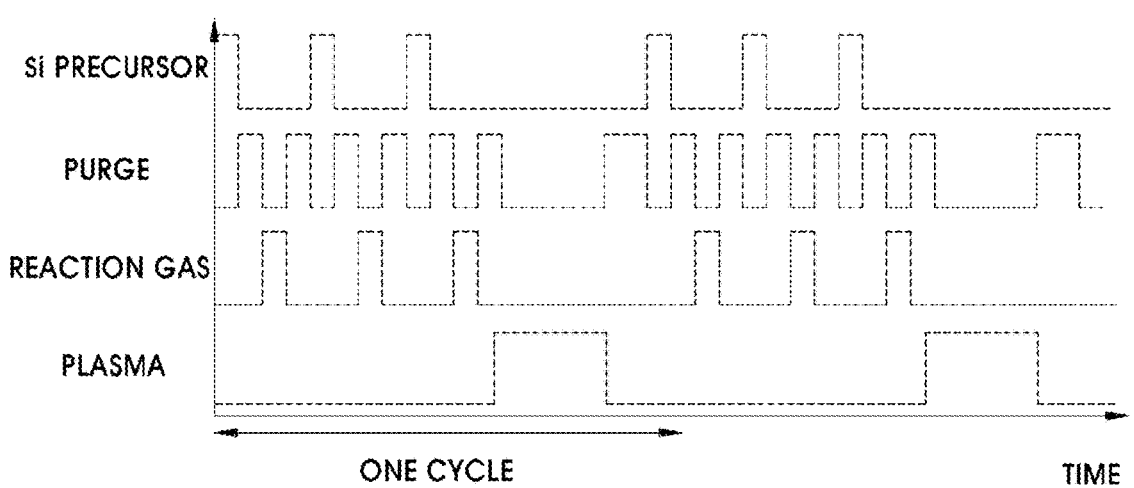
FIG. 3 represents the progress of a method of cyclically depositing a thin film, according to an embodiment of the present invention.

FIG. 3 represents the progress of a method of cyclically depositing a thin film, according to an embodiment of the present invention.

As shown in FIG. 3, the injection and purge of a silicon precursor and the injection and purge of the first reaction source are repeatedly performed. Purge after the injection of the silicon precursor and purge after the injection of the first reaction source are repeatedly performed, and then a plasma atmosphere is formed. In a state where the plasma atmosphere has been formed, a second reaction source may be injected when necessary.

An operation, where the injection and purge of the silicon precursor and the injection and purge of the first reaction source are repeatedly performed and then the plasma atmosphere is formed, is performed at one cycle. That is, an oxide including silicon is formed by repeatedly performing the injection and purge of a silicon precursor and the injection and purge of a reaction source, and thereafter, plasma treatment is performed on the oxide including silicon by forming a plasma atmosphere. Moreover, by repeating all the above-described operations, an oxide including silicon and having a desired thickness can be obtained.

Accordingly, the method of cyclically depositing the thin film can repeatedly perform the injection and purge of the silicon precursor and the injection and purge of the first reaction source, and moreover repeatedly form and plasma-treat the oxide including silicon.

The method of cyclically depositing the thin film, according to an embodiment of the present invention, will be specifically described on a step-by-step basis with reference to FIGS. 4A to 9. In the following description on FIGS. 4A to 9, reference numerals of FIGS. 1 to 3 may be used when necessary.

Figure 4A:
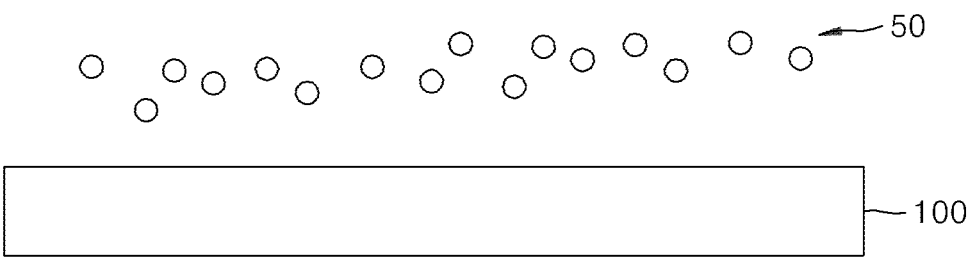
FIGS. 4A to 4C are sectional views illustrating an operation of depositing silicon, according to an embodiment of the present invention.
Figure 4B:
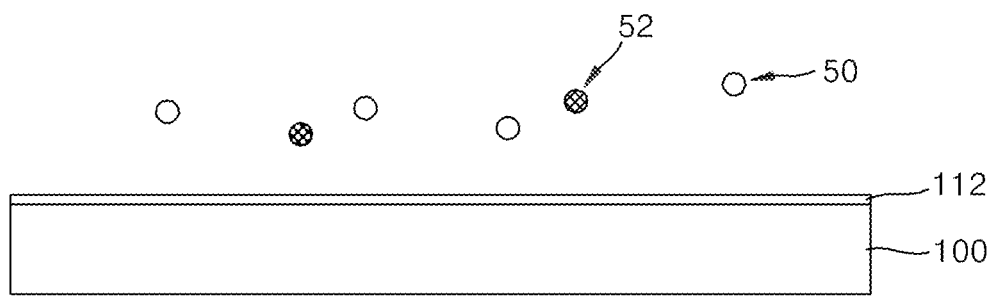
Figure 4C:
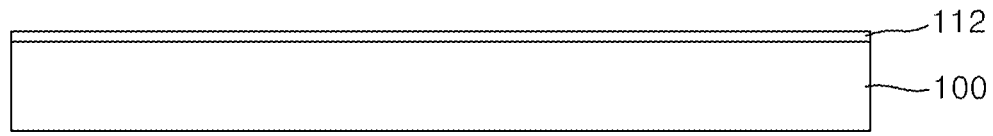

FIGS. 4A to 4C are sectional views illustrating an operation of depositing silicon, according to an embodiment of the present invention. FIG. 4A is a sectional view illustrating an operation of injecting a silicon precursor, according to an embodiment of the present invention.

Referring to FIG. 4A, a silicon precursor 50 is injected into the chamber 11 into which the substrate 100 is loaded.

The substrate 100, for example, may include a semiconductor substrate such as a silicon or compound semiconductor wafer. Alternatively, the substrate 100 may include a substrate material, which differs from a semiconductor, such as glass, metal, ceramic, and quartz.

The silicon precursor 50, for example, may be amino-based silane such as bisethylmethylaminosilane (BEMAS), bisdimethylaminosilane (BDMAS), BEDAS, tetrakisethylmethylaminosilane (TEMAS), tetrakisidimethylaminosilane (TDMAS), and TEDAS, or chloride-based silane such as hexachlorinedisilane (HCD).

The substrate 100 may maintain a temperature of about 50° C. to about 600° C. for reacting with the silicon precursor 50. Also, a pressure inside the chamber 11 into which the substrate 100 is loaded may maintain about 0.01 Torr to about 10 Torr.

FIG. 4B is a sectional view illustrating an operation of depositing silicon on a substrate, according to an embodiment of the present invention. Referring to FIG. 4B, by some of the silicon precursors 50 reacting with the substrate 100, a silicon atom may be deposited on the substrate 100, and thus, a silicon layer 112 may be formed. The silicon layer 112 may be formed as at least one silicon atomic layer.

Some of the silicon precursors 50 may react with the substrate 100, thereby forming one or more reacted byproducts 52. Also, the other of the silicon precursors 50 may be left in a non-reacted state without reacting with the substrate 100.

FIG. 4C is a sectional view illustrating an operation of performing a first purge operation, according to an embodiment of the present invention. Referring to FIG. 4C, the silicon layer 112 is formed on the substrate 100, and then a purge operation, which removes the left silicon precursors 50 in a non-reacted state and the reacted byproducts 52 from inside the chamber 11, may be performed. The purge operation, which removes the left silicon precursors 50 and the reacted byproducts 52 from inside the chamber 11, may be called a first purge operation.

In the first purge operation, the substrate 100 may maintain a temperature of about 50° C. to about 100° C. Also, a pressure inside the chamber 11 into which the substrate 100 is loaded may maintain about 0.01 Torr to about 10 Torr. That is, the constant temperature of the substrate 100 and a constant pressure inside the chamber 11 may be maintained in an operation of depositing the silicon layer 112 and the first purge operation.

Figure 5A:
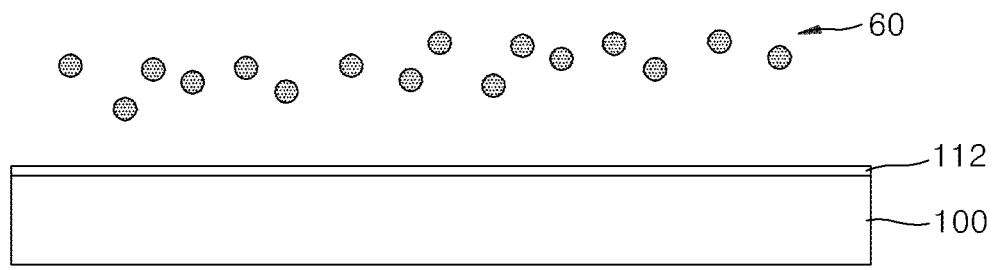
FIGS. 5A to 5C are sectional views illustrating an operation of forming an oxide including silicon, according to an embodiment of the present invention.
Figure 5B:
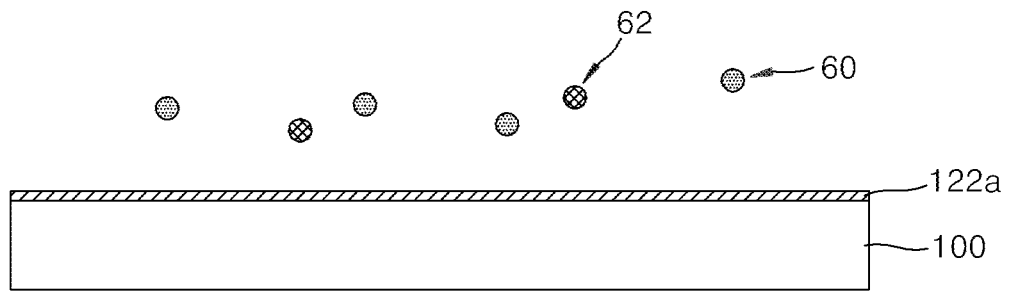
Figure 5C:
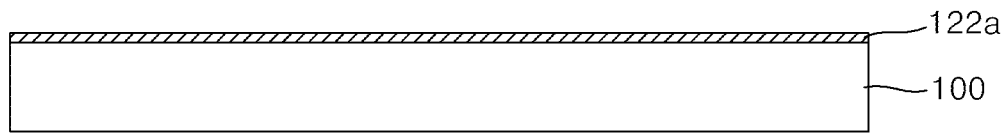

FIG. 5A to 5C are sectional views illustrating an operation of forming an oxide including silicon, according to an embodiment of the present invention. FIG. 5A is a sectional view illustrating an operation of injecting a reaction source, according to an embodiment of the present invention.

Referring to FIG. 5A, a first reaction source 60 is injected into the chamber 11 into which the substrate 100 is loaded. The first reaction source 60, for example, may be one or more sources selected from the group consisting of $O_2$, $O_3$, and $N_2O$. Alternatively, the first reaction source 60, for example, may be O* (oxygen radical) or $O_2$— (oxygen anion) that is formed of plasma at an $O_2$ atmosphere.

The substrate 100 may maintain a temperature of about 50° C. to about 600° C. for reacting with the first reaction source 60. Also, a pressure inside the chamber 11 into which the substrate 100 is loaded may maintain about 0.01 Torr to about 10 Torr.

FIG. 5B is a sectional view illustrating an operation of depositing an oxide including silicon on a substrate, according to an embodiment of the present invention. Referring to FIG. 5B, by some of the first reaction source 60 reacting with the silicon layer 112, an oxide 122a including silicon may be formed on the substrate 100.

The first reaction source 60 may react with the silicon layer 112, thereby forming a reacted byproduct 62. Also, the other of the first reaction source 60 may be left in a non-reacted state without reacting with the silicon layer 112.

For example, when a source including an oxygen atom such as $O_2$ or $O_3$ is used as the first reaction source 60, or O* (oxygen radical) or $O_2$— (oxygen anion) that is formed of plasma at an $O_2$ atmosphere is used as the first reaction source 60, the silicon layer 112 may react with the oxygen atom included in the first reaction source 60 and thus be formed as a silicon oxide layer.

FIG. 5C is a sectional view illustrating an operation of performing a second purge operation, according to an embodiment of the present invention. Referring to FIG. 5C, the oxide 122a including silicon is formed on the substrate 100, and then a purge operation, which removes the left first reaction source 60 in a non-reacted state and the reacted byproducts 62 from inside the chamber 11, may be performed. The purge operation, which removes the left first reaction source 60 and the reacted byproducts 62 from inside the chamber 11, may be called a second purge operation.

In the second purge operation, the substrate 100 may maintain a temperature of about 50° C. to about 600° C. Also, a pressure inside the chamber 11 into which the substrate 100 is loaded may maintain about 0.01 Torr to about 10 Torr.

Figure 6:
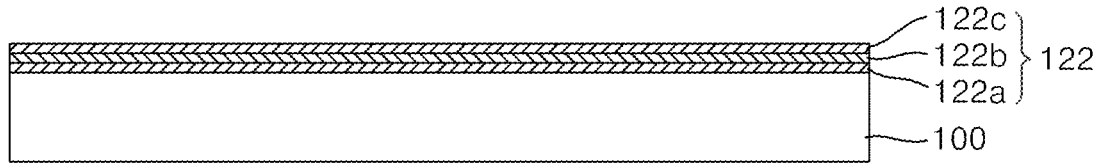
FIG. 6 is a sectional view illustrating an oxide formed of a plurality of silicon, according to an embodiment of the present invention.

FIG. 6 is a sectional view illustrating an oxide formed of a plurality of silicon, according to an embodiment of the present invention. Referring to FIG. 6, by repeating the operations of FIG. 4A to 5C, an oxide layer 122 including a plurality of oxides 122a to 122c including a plurality of silicon is formed. The oxide layer 122 may have a thickness of twenty Å to several tens of Å. An operation of depositing the oxides 122a, 122b or 122c including each silicon may be repeatedly performed three to ten times such that the oxide layer 122 includes the oxides 122a to 122c including silicon, three times to fifty times.

In this way, when the oxide layer 122 is formed to include the oxides 122a to 122c including a plurality of silicon, the oxide layer 122 can have excellent layer properties and step coverage.

Figure 7A:
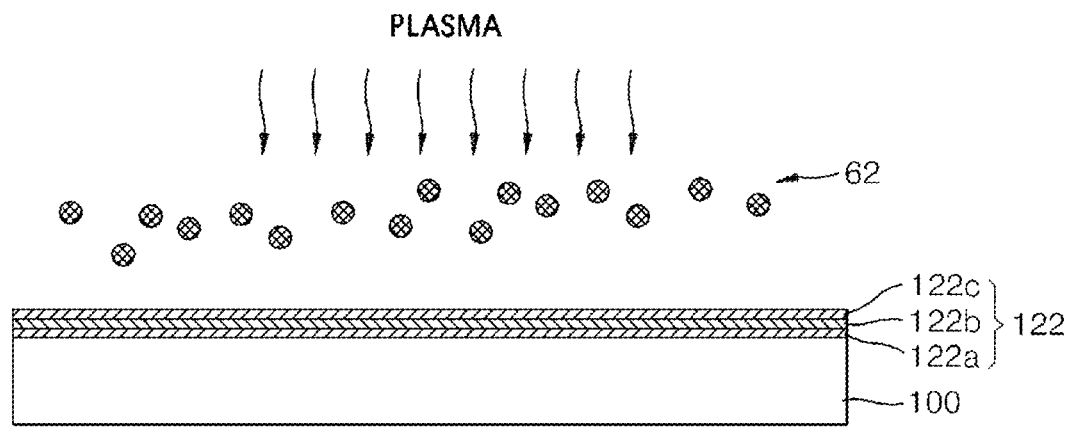
FIGS. 7A and 7B are sectional views of an operation of performing plasma treatment on an oxide, according to an embodiment of the present invention.
Figure 7B:
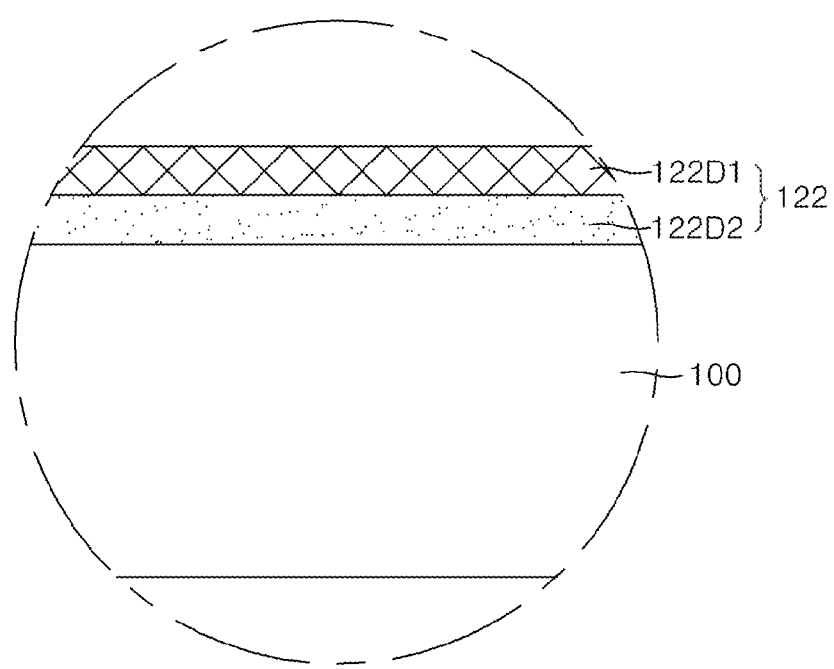

FIGS. 7A and 7B are sectional views of an operation of performing plasma treatment on an oxide, according to an embodiment of the present invention. FIG. 7A is a sectional view illustrating an operation of supplying a plasma atmosphere to an oxide layer, according to an embodiment of the present invention.

Referring to FIG. 7A, plasma is applied onto the substrate 100 where the oxide layer 122 is formed. That is, a plasma atmosphere is formed inside the chamber 11 into which the substrate 100 is loaded. To form the plasma atmosphere, Inductively Coupled Plasma (ICP), Capacitively Coupled Plasma (CCP) or Microwave (MW) Plasma may be used. In this case, a power of about 100 W to about 3 kW may be applied for forming the plasma atmosphere.

To form the plasma atmosphere, one or more ignition gases selected from the group consisting of Ar, He, Kr, and Xe may be injected. In this case, the ignition gas may be injected at a flow rate of about 100 sccm to about 3000 sccm.

A second reaction source 64 may be additionally injected at the plasma atmosphere. The second reaction source 64, for example, may be one or more gases selected from the group consisting of $N_2$ and $NH_3$.

FIG. 7B is a sectional view of the oxide layer 122D according to an embodiment of the present invention. Referring to FIGS. 7A and 7B, plasma treatment is performed on the oxide layer 122 at a plasma atmosphere, and sine a nitrogen atom is arranged on the upper part of the oxide layer 122, the upper part 122D1 of the oxide layer 122 has a silicon oxynitride (SiON) form but the lower part 122D2 of the oxide layer 122 has a silicon oxide ($SiO_2$) form. As shown in FIG. 6, since there are boundaries among the oxides 122a to 122c, the boundaries among the oxides 122a to 122c work as a boundary for the plasma treatment, the boundary between the upper part 122D1 and the lower part 122D2 of the oxide layer 122 may match with one of the boundaries among the oxides 122a to 122c and it is possible to distinguish the upper part 122D1 of the oxide layer 122 from the lower part 122D2 thereof along a corresponding boundary.

Also, densification may be performed on the oxide layer 122 and for plasma treatment, the pressure of the chamber 11 into which the substrate 100 is loaded may be maintained at 0.05 Torr to 10 Torr. Also, the oxide layer 122D that is obtained by processing the oxide layer 122 at the plasma atmosphere can have good layer properties such as insulation. Particularly, even when the densified oxide layer 122D is formed to have a thin thickness, the densified oxide layer 122D can have good layer properties.

Figure 8:
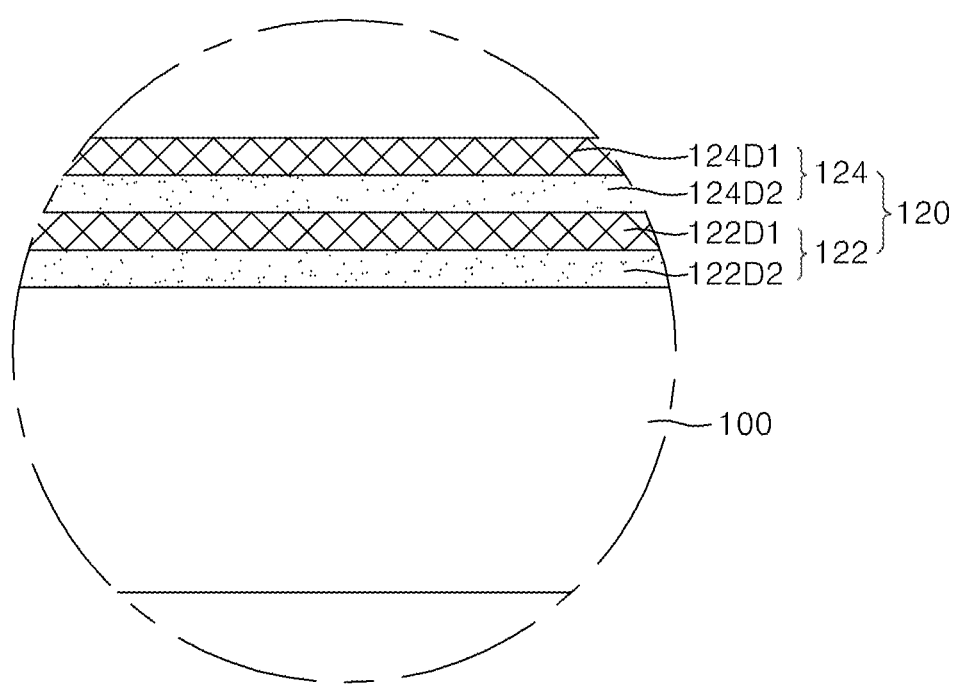
FIG. 8 is a cross-sectional view of an oxide including silicon according to another embodiment of the present invention.

FIG. 8 is a cross-sectional view of an oxide including silicon according to another embodiment of the present invention. Referring to 8, by repeating steps described in FIGS. 4A to 7B, it is possible to form an oxide 120 including a plurality of densified oxide layers 122 and 124, and as described above, the upper part 124D1 of the oxide layer 124 generally has a silicon oxynitride (SiON) form but the lower part 124D2 of the oxide layer 124 generally has a silicon oxide ($SiO_2$) form. When the oxide layer 122 shown in FIG. 7A is relatively thin, the lower part of the oxide layer 122 may be affected relatively less by plasma or the second reaction source 64. Thus, in order to enhance the layer property of the oxide layer 120, it is possible to form the oxide 120 including a plurality of densified oxide layers 122 and 124 that is relatively thin.

Also, although FIG. 8 shows that the oxide 120 includes two densified oxide layers 122 and 124, it is also possible to include three or more densified oxide layers. That, the number of the densified oxide layers including the oxide 120 may be determined in consideration of the desired thickness of the oxide 120. That is, in consideration of the desired thickness of the oxide 120, it is possible to determine the number of repetitions of steps described in FIGS. 4A to 7B.

Figure 9:
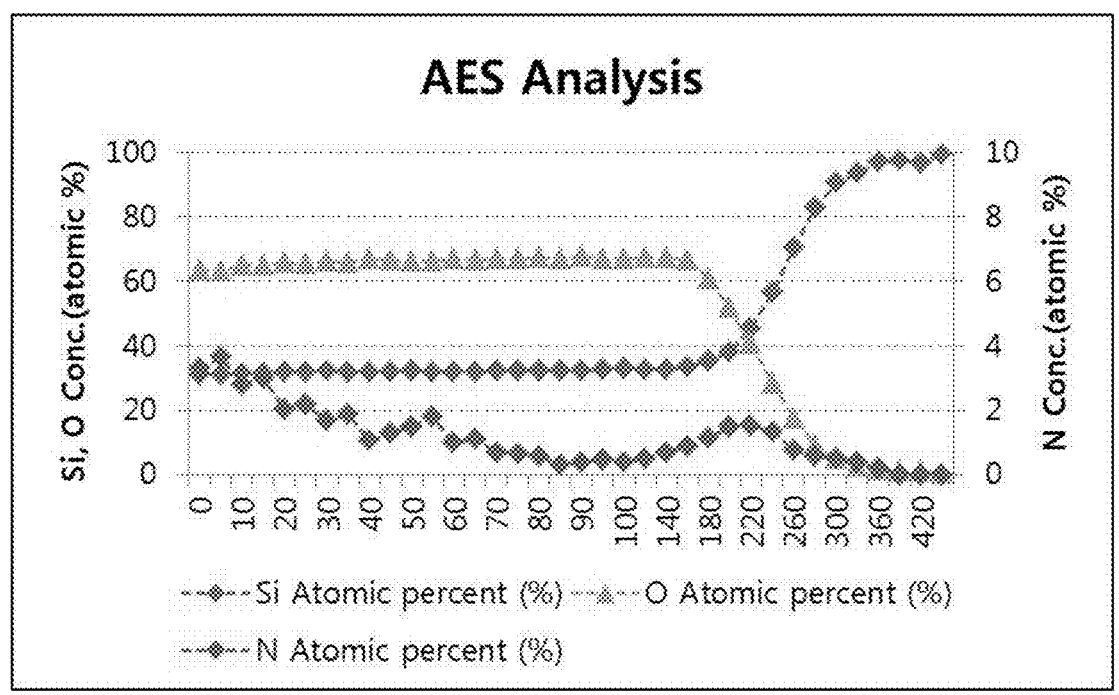
FIG. 9 is a graph of the composition ratio of the oxide of FIG. 8.

FIG. 9 is a graph of the composition ratio of the oxide of FIG. 8, the horizontal axis represents a depth from the surface of the oxide and the vertical axis represents atomic %. As shown in FIG. 9, silicon and oxygen are regularly distributed in the oxide 120 and nitrogen is represented by a step form from the surface on which the horizontal value is zero. As described above, since the upper parts 122D1 and 124D1 of the oxide layers 122 and 124 generally have a silicon oxynitride (SiON) form but the lower parts 122D2 and 124D2 of the oxide layers 122 and 124 generally have a silicon oxide ($SiO_2$) form, it is represented that the composition ratio of nitrogen in the upper parts 122D1 and 124D1 of the oxide layers 122 and 124 is high but the composition ratio of nitrogen in the lower parts 122D2 and 124D2 of the oxide layers 122 and 124 is low. The composition ratio of nitrogen decreases with the depth of the oxide 120 because nitrogen present in the upper parts 122D1 and 124D1 of the oxide layers 122 and 124 is vertically spread and accumulated on the surface of the oxide 120. As a result, it is considered that the surface of the oxide 120 has the maximum composition in nitrogen.

Semiconductor memory devices storing data may be generally divided into volatile and non-volatile memory devices. The volatile memory device loses stored data when power is cut off but the non-volatile memory device maintains stored data even when power is cut off.

The non-volatile memory device uses threshold voltage transition of a transistor, charge displacement, and a variation in resistance, for example. A memory device using the threshold voltage transition is called a charge storage memory device in that it has a storage node for storing charges. For example, a floating gate type memory device using a floating gate as a storage node and a SONOS type memory device using a charge trap layer as a storage node belong to a charge trap type memory device.

Figure 10:
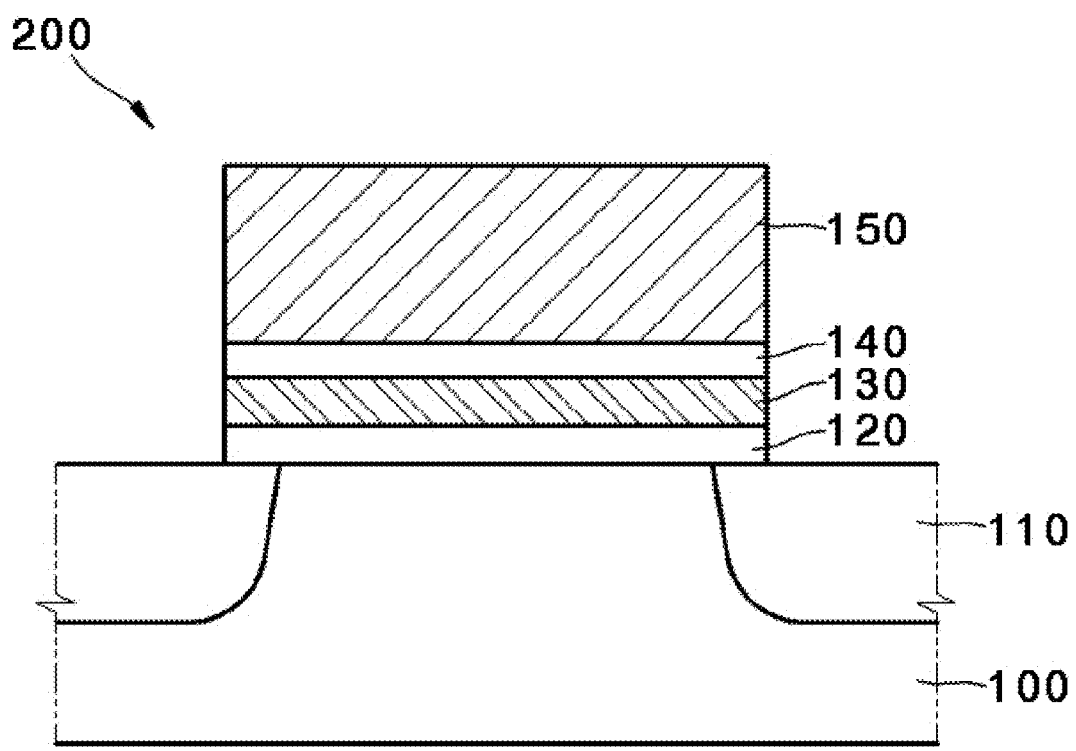
FIG. 10 is a cross-sectional view of a charge trap type semiconductor device.

FIG. 10 is a cross-sectional view of a charge trap type semiconductor device. As shown in FIG. 10, a memory device 200 uses a nitride 130 for charge capture (or trap) as a storage node. Alternatively, a nitride ($Si3N4$) 130 may be replaced with a single or multiple layers including one or more selected from a group consisting of silicon oxide ($SiO_2$), silicon oxynitride (SiON), silicon rich nitride (SRN), aluminum oxide ($Al_2O_3$), aluminum nitride (AlN), hafnium oxide ($HfO_2$), hafnium silicon oxide (HfSiO), hafnium silicon (HfSiON), hafnium oxynitride (HfON), hafnium aluminum oxide (HfAlO), zirconium oxide ($ZrO_2$), tantalum oxide ($Ta_2O_3$), hafnium tantalum oxide (HfTaxOy), lanthanum oxide (LaO), lanthanum aluminum oxide (LaAlO), lanthanum hafnium oxide (LaHfO) and hafnium aluminum oxide (HfAlO). A tunnel insulating layer, such as an oxide 120 for tunneling charges or injecting hot carriers is formed between the nitride 130 being a storage node and a semiconductor substrate 100.

Also, a charge blocking layer, such as a silicon oxide 140 is formed between the nitride 130 and a control gate electrode 150. Alternatively, the oxide ($SiO_2$) 140 may be replaced with any one selected from a group consisting of silicon oxynitride (SiON), silicon nitride ($Si_3N_4$), silicon rich nitride (SRN), aluminum oxide ($Al_2O_3$), aluminum nitride (AlN), hafnium oxide ($HfO_2$), hafnium silicon oxide (HfSiO), hafnium silicon (HfSiON), hafnium oxynitride (HfON), hafnium aluminum oxide (HfAlO), zirconium oxide ($ZrO_2$), tantalum oxide ($Ta_2O_3$), hafnium tantalum oxide (HfTaxOy), lanthanum oxide (LaO), lanthanum aluminum oxide (LaAlO), lanthanum hafnium oxide (LaHfO) and hafnium aluminum oxide (HfAlO) or with a combination thereof. Also, the oxide 120 may be replaced with a single layer in which two or more materials selected from the group are mixed, or multiple layers which includes a plurality of layers which respectively includes any one or more materials selected from the group The semiconductor substrate 100 may be, for example, a silicon substrate, and the control gate electrode 150 may be formed of polysilicon, for example. Alternatively, the control gate electrode 150 may include any one selected from a group consisting of aluminum (Al), ruthenium (Ru), tantalum nitride (TaN), titanium nitride (TiN), tungsten (W), tungsten nitride (WN), hafnium nitride (HfN), and tungsten silicide (WSi), or a combination thereof.

In conclusion, the memory device 200 has a SONOS structure in which oxide 120/nitride 130/oxide 140 are disposed between the silicon substrate 100 and the polysilicon 150. The write operation of the memory device 200 is performed by applying a positive write voltage to the control gate electrode 150. Thus, electrons accelerated at a source/ drain unit 110 may obtain energy and be injected into the nitride 130. Alternatively, the electrons of the semiconductor substrate 100 may also be injected into the nitride 130 by tunneling. An erasing operation may be performed by applying a negative voltage to the control gate electrode 150 or applying a positive voltage to the semiconductor substrate 100. Thus, the electrons stored in the nitride 130 are erased with the semiconductor substrate 100 by tunneling.

Since the oxide 120 as described above may be used as the tunnel insulating layer of a charge trap type semiconductor device and the oxide 120 includes a plurality of oxide layers, each oxide layer has a structure in which an upper part generally having a silicon oxynitride (SiON) form and a lower part generally having a silicon oxide ($SiO_2$) form are alternately stacked. Such a structure enables easy charge displacement on programming/erasing in the memory device 200.

Figure 11:
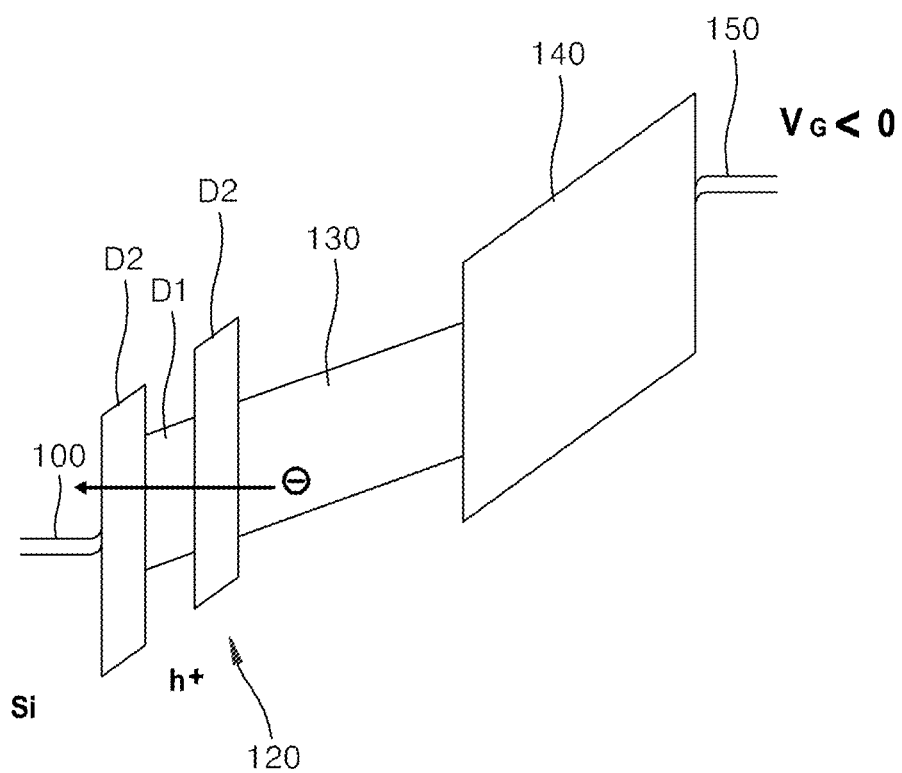
FIG. 11 illustrates an energy band in a semiconductor device.

FIG. 11 illustrates an energy band in a semiconductor device. As shown in FIG. 11, the energy band gap of the oxide 120 is larger in comparison to that of the nitride 130, and an upper part D1 has an energy band which the gap between a conductive band and a valence electron band has decreased as it contains nitrogen atoms. Also, as the content of nitrogen atoms in the upper part D1 increases, the difference between the conductive band and the valence electron band decreases. When an erasing voltage is applied to the control gate electrode 150, electrons stored in the nitride 130 transfers to the semiconductor substrate 100 through the oxide 120 and thus there is an effect of enabling easy electron transfer by the decreased energy level of the conductive band.

In other words, the erasing operation properties of a general SONOS type memory device depend on the tunneling currents of electrons and holes. In general, when the thickness of a tunneling insulating layer is thin, the operation property of a device is improved but leakage current increases and thus there is a limitation in that data retention decreases. On the contrary, a thick tunneling insulating layer has a limitation in that the programming/erasing speed of a device decreases. Also, a high erasing voltage is needed to improve the erasing speed of the device. In the present embodiment, it is possible to increase the erasing speed of the device by improving the operation property of the device without decreasing the thickness of the oxide 120, and the thickness of the oxide 120 may be 20 Å to 100 Å.

In particular, the memory device has a thickness determined for the oxide 120 depending on the property of each product and equivalent oxide thickness (EOT) is determined based on the thickness of a pure oxide ($SiO_2$). For example, in a case where the EOT needed by a specific product is 50 Å, the oxide is formed with a thickness of 55 Å to 60 Å since the EOT is only 45 Å when the oxide 120 is formed with a thickness of 50 Å by using a method according to the present embodiment. However, while there is no problem with a decrease in an erasing speed due to an increase in thickness of the oxide 120 as described below, there is an advantage in that it is possible to maintain data retention through the sufficient thickness of the oxide 120.

In this case, nitrogen concentration in the oxide 120 may be 0.5 atomic % to 20 atomic %. When the nitrogen concentration in the oxide 120 is lower than 0.5 atomic %, there is little plasma processing effect and thus there is little erasing speed improving effect to be described below. On the contrary, when the nitrogen concentration exceeds 20 atomic %, leakage current increases and thus there is a limitation in that data retention decreases.

Figure 12:
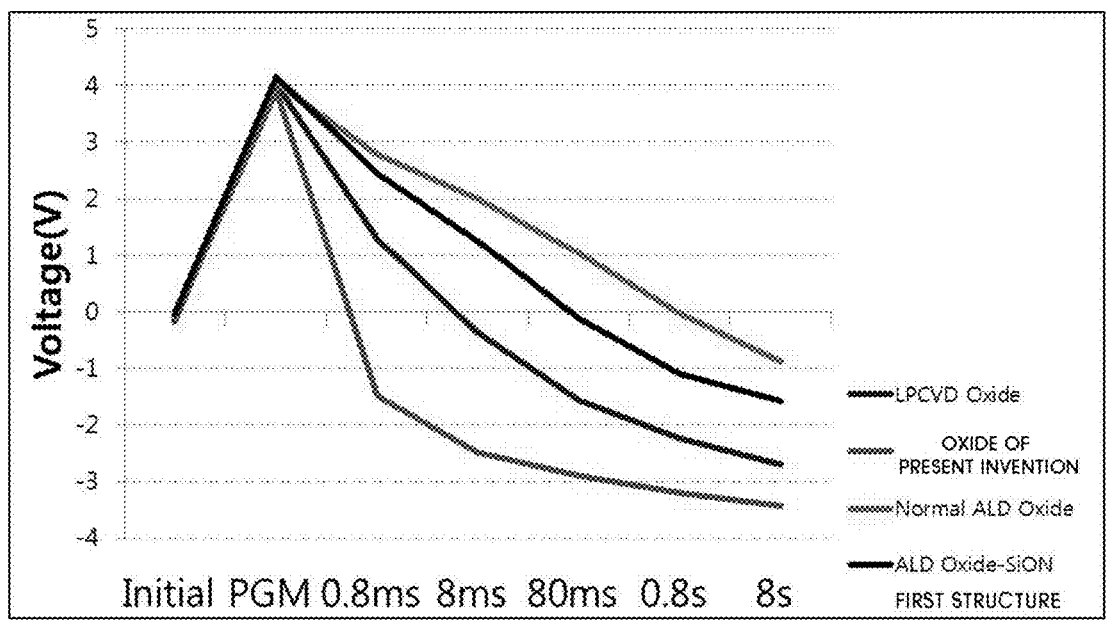
FIG. 12 is a graph of the erasing property of a semiconductor device.

FIG. 12 is a graph of the erasing property of a semiconductor device. PGM means a state in which programming (storing charges in the nitride 130) is performed when a voltage is initially applied. As shown in FIG. 12, it may be checked that the memory device 200 having the oxide 120 according to an embodiment of the present invention represents the fastest erasing speed, when the same voltage is applied (such as at −1 V). When classifying according to the erasing speed, memory devices are in a sequence of a memory device (blue line) having an oxide deposited through low pressure chemical vapor deposition (LPCVD), a memory device (black line) obtained by performing nitrogen plasma processing on the upper part of an oxide deposited through atomic layer deposition (ALD), and a memory device (red line) having an oxide deposited through the ALD. That is, as in the embodiment of the present invention, it may be seen that the memory device having the oxide obtained by nitrogen plasma processing through cyclic thin film deposition represents the fastest erasing speed and the memory device obtained by performing nitrogen plasma processing on the upper part of the oxide deposited through the ALD represents a low erasing speed.

According to an embodiment of the present invention, it is possible to form an oxide having a thin thickness, an excellent layer property and step coverage. Thus, in order to realize a highly-integrated semiconductor device, it is possible to form an oxide having a thin thickness and since the step coverage is also excellent, it is possible to realize a fine structure. Also, since there is an excellent layer property, it is possible to satisfy performance needed by a highly-integrated semiconductor device. In particular, it is possible to significantly improve the erasing speed of a semiconductor device.

Although the present invention has been described through exemplary embodiments, other embodiments may also be implemented. Therefore, the technical spirit and scope of the following claims are not limited to the exemplary embodiments.

What is claimed is:
1. A method of cyclically depositing a thin film, the method comprising:
depositing an oxide layer including a plurality of oxides by repeatedly performing an oxide depositing operation, the oxide depositing operation including
a deposition operation,
a first purge operation,
a reaction operation, and
a second purge operation,
wherein the deposition operation deposits silicon on a target by injecting silicon precursors into a chamber into which the target is loaded,
the first purge operation removes non-reacted silicon precursors and a reacted byproduct from inside the chamber,
the reaction operation supplies a first reaction source comprising oxygen into the chamber to form the deposited silicon as an oxide comprising silicon, and
the second purge operation removes a non-reacted first reaction source and a reacted byproduct from the inside of the chamber; and
performing a plasma processing operation to the oxide layer by supplying plasma made of a second reaction source including nitrogen to the inside of the chamber, whereby an upper part of the oxide layer is formed as a silicon oxynitride layer and a lower part of the oxide layer is formed as a silicon oxide layer, wherein before performing the plasma processing operation, the oxide depositing operation is repeated three times to fifty times, and wherein said depositing an oxide layer and said performing a plasma processing operation are repeated.

2. The method of claim 1, wherein the first reaction source is one or more gases selected from the group comprising $O_2$ and $O_3$.

3. The method of claim 2, wherein the plasma processing operation comprises injecting one or more ignition gases selected from the group comprising Ar, He, Kr and Xe and generating the plasma from the second reaction source.

4. The method of claim 1, wherein the reaction operation comprises using, $O_2$— (oxygen anion) or O* (oxygen radical) formed by using plasma at $O_2$ atmosphere, as the first reaction source.

5. The method of claim 3, wherein the second reaction source is one or more gases selected from the group comprising $N_2$ and $NH_3$.

6. The method of claim 1, wherein in the oxide deposition operation, an internal pressure of the chamber is 0.01 Torr to 10 Torr.

7. The method of claim 1, wherein in the plasma processing operation, an internal pressure of the chamber is 0.01 Torr to 10 Torr.

8. A method of manufacturing semiconductor, the method comprising depositing a tunnel oxide layer through the method of claim 1.

9. The method of claim 8, wherein a thickness of the tunnel oxide layer is 20 Å to 100 Å.

10. The method of claim 9, wherein a nitrogen concentration in the tunnel oxide layer is 0.5 atomic % to 20 atomic %.

11. The method of claim 8, wherein a capture layer, a charge blocking layer and a gate layer are sequentially formed on the tunnel oxide layer.

* * * * *